US007511596B2

(12) United States Patent
Chung et al.

(10) Patent No.: US 7,511,596 B2
(45) Date of Patent: Mar. 31, 2009

(54) DUAL BANDPASS FILTER HAVING SERIAL CONFIGURATION OF COUPLED-LINE FILTERS

(75) Inventors: Shyh-Jong Chung, Guansi Township, Hsinchu County (TW); Ke-Chiang Lin, Bade (TW); Chun-Fu Chang, Meinong Township, Kaohsiung County (TW)

(73) Assignee: National Chiao Tung University, Hsinchu (TW)

( * ) Notice: Subject to any disclaimer, the term of this patent is extended or adjusted under 35 U.S.C. 154(b) by 252 days.

(21) Appl. No.: 11/478,678

(22) Filed: Jul. 3, 2006

(65) Prior Publication Data

US 2007/0257746 A1 Nov. 8, 2007

(30) Foreign Application Priority Data

May 5, 2006 (TW) .............................. 95115984 A

(51) Int. Cl.
*H03H 7/00* (2006.01)
*H03H 7/01* (2006.01)

(52) U.S. Cl. ....................... 333/175; 333/167; 333/174; 333/177

(58) Field of Classification Search ....................... None
See application file for complete search history.

(56) References Cited

U.S. PATENT DOCUMENTS

2005/0068126 A1 * 3/2005 Muto ......................... 333/204
2006/0046682 A1 * 3/2006 Chen .......................... 455/339

OTHER PUBLICATIONS

Dual-Band Bandpass Filter Using Coupled Resonator Pairs, Cheng-Chung Chen, IEEE Microwave and Wireless Components Letters, vol. 15, No. 4, Apr. 2005, pp. 259-261.

* cited by examiner

*Primary Examiner*—Anh Q Tran
(74) *Attorney, Agent, or Firm*—Troxell Law Office, PLLC

(57) ABSTRACT

Two second-order bandpass filter are connected serially to obtain a dual bandpass filter. One is inductive and the other is capacitive. One has a low passband and the other has a high passband. Between them, a finite transmission zero is formed to suppress noise. The present invention achieves a passband as wide as 1 gigahertz so that it can be applied to a wireless local network, communication equipments and electronic devices.

14 Claims, 4 Drawing Sheets

DUAL BANDPASS FILTER HAVING SERIAL CONFIGURATION OF COUPLED-LINE FILTERS

FIELD OF THE INVENTION

The present invention relates to a bandpass filter; more particularly, relates to serially connecting a second-order inductive/capacitive bandpass filter at low passband and a second-order capacitive/inductive bandpass filter at high passband to obtain a dual bandpass filter.

DESCRIPTION OF THE RELATED ART

A prior art of a dual bandpass filter is proclaimed in Taiwan, having a first passband and a second passband corresponding to a first frequency and a second frequency. The dual bandpass filter comprises a first pair of resonators including a first resonator and a second resonator, the first resonator and the second resonator sharing a first grounding transmission line, the grounding transmission line grounding at an end, the first resonator and the second resonator coupling with each other by the grounding transmission line; a second pair of resonators including a third resonator and a fourth resonator, the third resonator and the fourth resonator sharing a second grounding transmission line, the second grounding transmission line grounding at an end, the third resonator and the fourth resonator coupling with each other by the second grounding transmission line; and a coupler between the first pair of resonators and the second pair of resonators to couple the first pair of resonators and the second pair of resonators to obtain the first passband and the second passband.

Although the prior art uses pairs of resonators and obtains two mutually-coupled pairs of resonators to obtain dual response and a finite transmission zero is obtained between two passbands through a transmission line connecting the two pairs of resonators, the bandwidth at high passband in the dual bandpass filter is obviously not wide enough in this structure while having high insertion loss. As a result, signals passing this filter have small energy and the performance of the whole circuit is not good. Hence, the prior art does not fulfill users' requests on actual use.

SUMMARY OF THE INVENTION

The main purpose of the present invention is to use impedance series to obtain a finite transmission zero in order to suppress noise and to obtain a wide bandwidth at a high passband and a low insertion loss at the passband.

To achieve the above purpose, the present invention is a dual bandpass filter having a serial configuration of coupled-line filters, comprising a second-order inductive bandpass filter at low passband and a second-order capacitive bandpass filter at high passband.

Therein, the second-order inductive bandpass filter at low passband has a first input connected with a direct-current (DC) capacitor connecting to a first resonator; the first resonator is coupled with a second resonator in a way of a mutual inductive coupling; the second resonator is connected with a DC capacitor to connecting to a first output; an end of the first resonator and an end of the second resonator are respectively connected with a second input and a second output of the second-order capacitive bandpass filter at high passband.

And, the second-order capacitive bandpass filter at high passband connects to the second input with an end of the first resonator; the second input is connected with a third resonator; the third resonator is coupled with a fourth resonator in a way of a mutual capacitive coupling to be connected with the second output; and, the third resonator and the fourth resonator of the second-order inductive bandpass filter at high passband are grounded.

Accordingly, a novel dual bandpass filter having a serial configuration of coupled-line filters is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 is a structural view showing the circuit of the first preferred embodiment according to the present invention;

DESCRIPTION OF THE PREFERRED EMBODIMENTS

The following descriptions of the preferred embodiments are provided to understand the features and the structures of the present invention.

Figure 1:
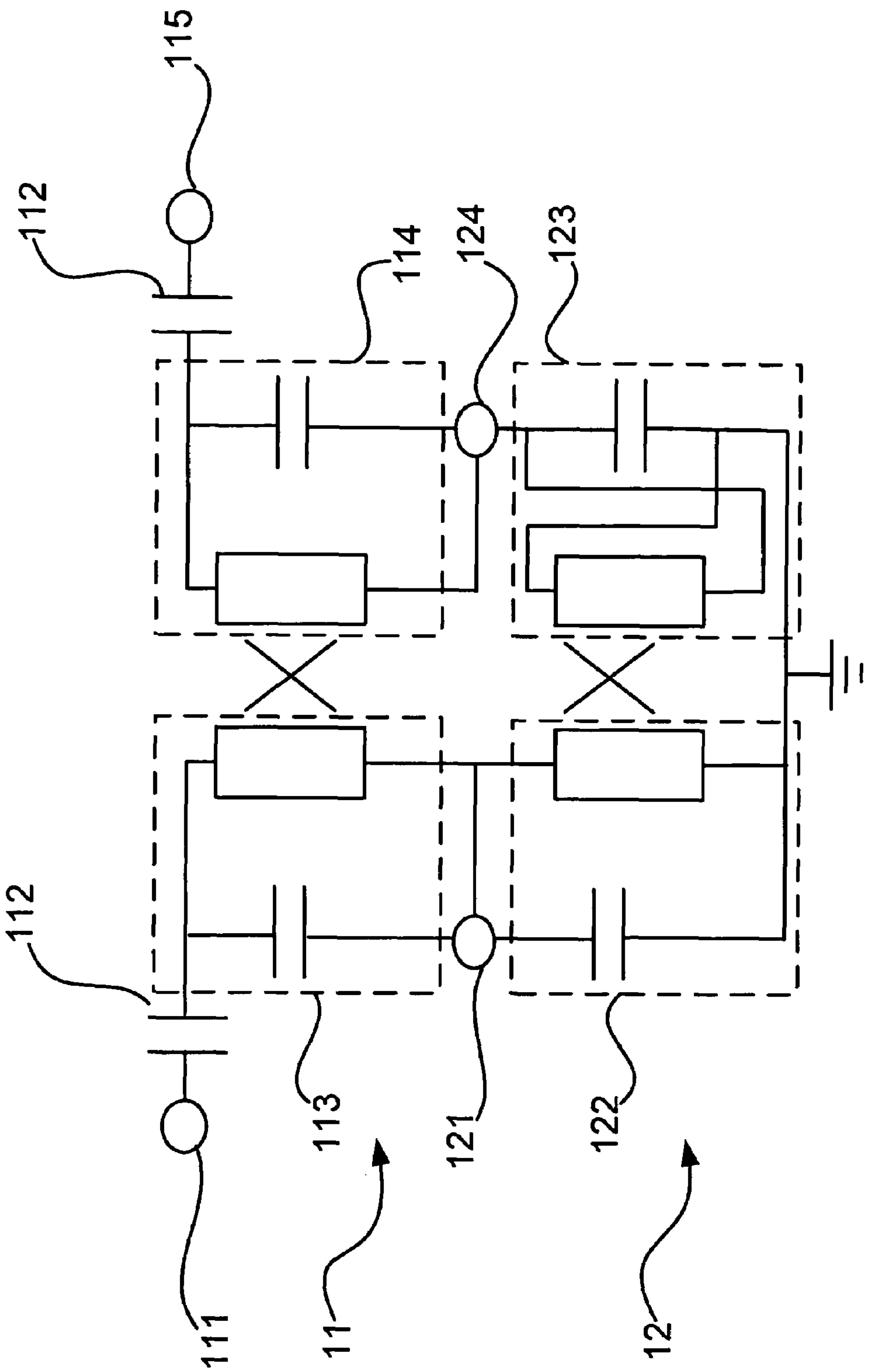

Please refer to FIG. 1, which is a structural view showing the circuit of a first preferred embodiment according to the present invention. As shown in the figure, the present invention is a dual bandpass filter having a serial configuration of coupled-line filters, comprising a first second-order inductive bandpass filter 11 and a first second-order capacitive bandpass filter 12.

The first second-order inductive bandpass filter 11 has a first input 111 connected with a direct-current (DC) capacitor 112 connecting to a first resonator 113; the first resonator 113 is coupled to a second resonator 114 in a way of a mutual inductive coupling; and, the second resonator 114 is connected with a first DC capacitor 112 connecting to a first output 115. Therein, an end of the first resonator 113 and an end of the second resonator 114 are respectively connected with a second input 121 and a second output 124 of the first second-order capacitive bandpass filter 12.

The first second-order capacitive bandpass filter 12 is connected to an end of the first resonator 113 with the second input 121; the second input 121 is connected to a third resonator 122; and, the third resonator 122 is coupled with a fourth resonator 123 in a way of a mutual capacitive coupling to be connected with the second output 124. Therein, the third resonator 122 and the fourth resonator 123 of the first second-order capacitive bandpass filter 12 are grounded; and, the first resonator 113 and the second resonator 114 are respectively connected with the third resonator 122 and the fourth resonator 123.

The first second-order capacitive bandpass filter 12 has inverted coupled-lines to obtain a mutual capacitive coupling with a phase having a 180 degrees of difference to a phase of the first second-order inductive bandpass filter 11. Thus, the first second-order inductive bandpass filter 11 is serially connected with the first second-order capacitive bandpass filter 12; and, by the impedance series of the first second-order inductive bandpass filter 11 and the first second-order capacitive bandpass filter 12, a finite transmission zero is obtained in a passband zone between the two bandpass filters. Therein, the first second-order inductive bandpass filter 11 has a passband between 2 gigahertz (GHz) and 3 GHz, having a bandwidth of 100 megahertz (MHz); and, the first second-order capacitive bandpass filter 12 has a passband between 5 GHz and 6 GHz, having a bandwidth of 1 GHz.

Figure 2:
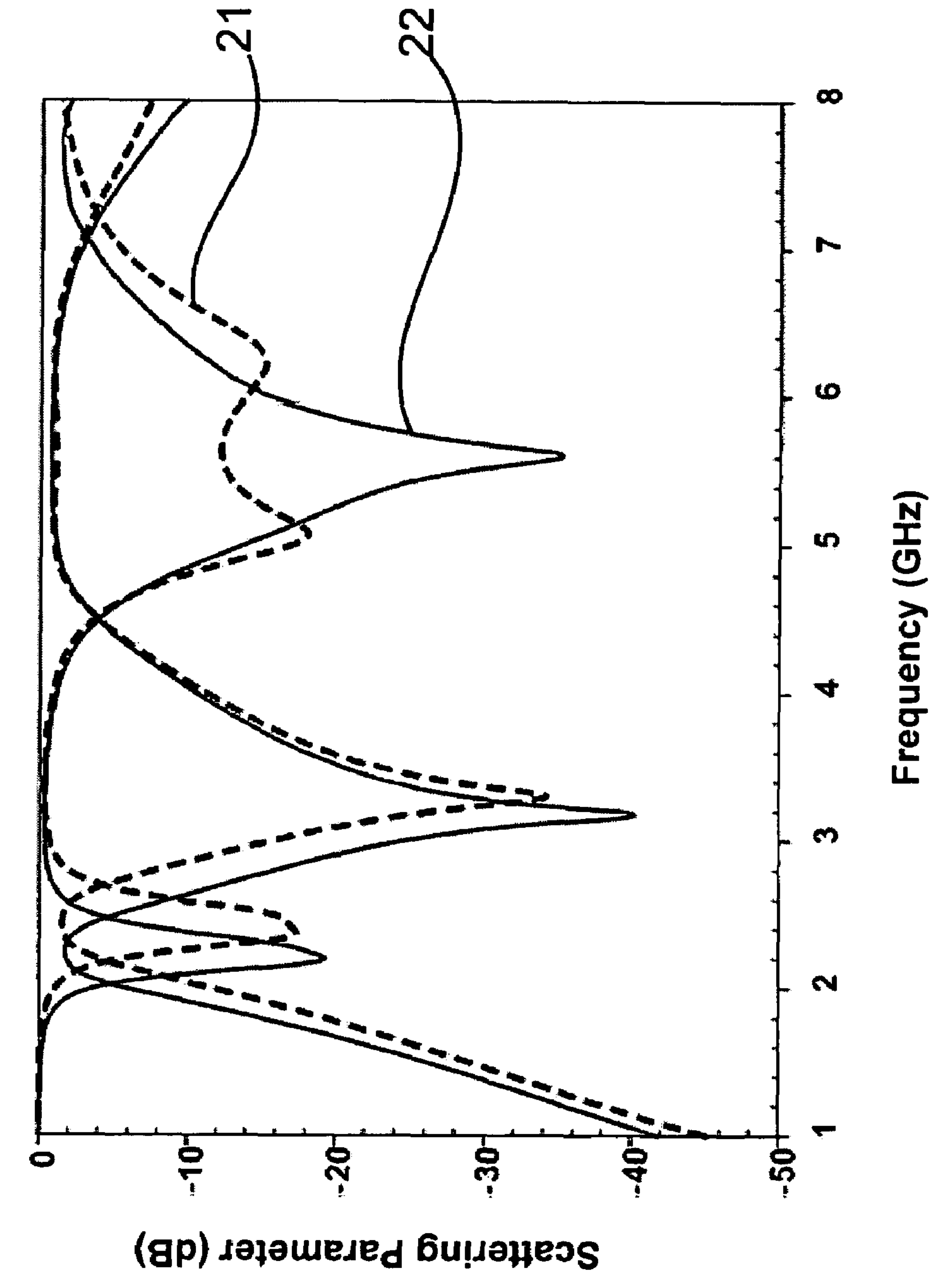
FIG. 2 is a view showing the spectrum of the first preferred embodiment.

Please refer to FIG. 2, which is a view showing the spectrum of the first preferred embodiment. As shown in the figure, an electromagnetic (EM) simulation curve 21 and a curve of measurement 22 of the first preferred embodiment are obtained, where, in a circuit structure of the first preferred embodiment, a finite transmission zero in a passband zone between a second-order inductive bandpass filter and a second-order capacitive bandpass filter is obtained to suppress noise to less than −40 dB.

Figure 3:
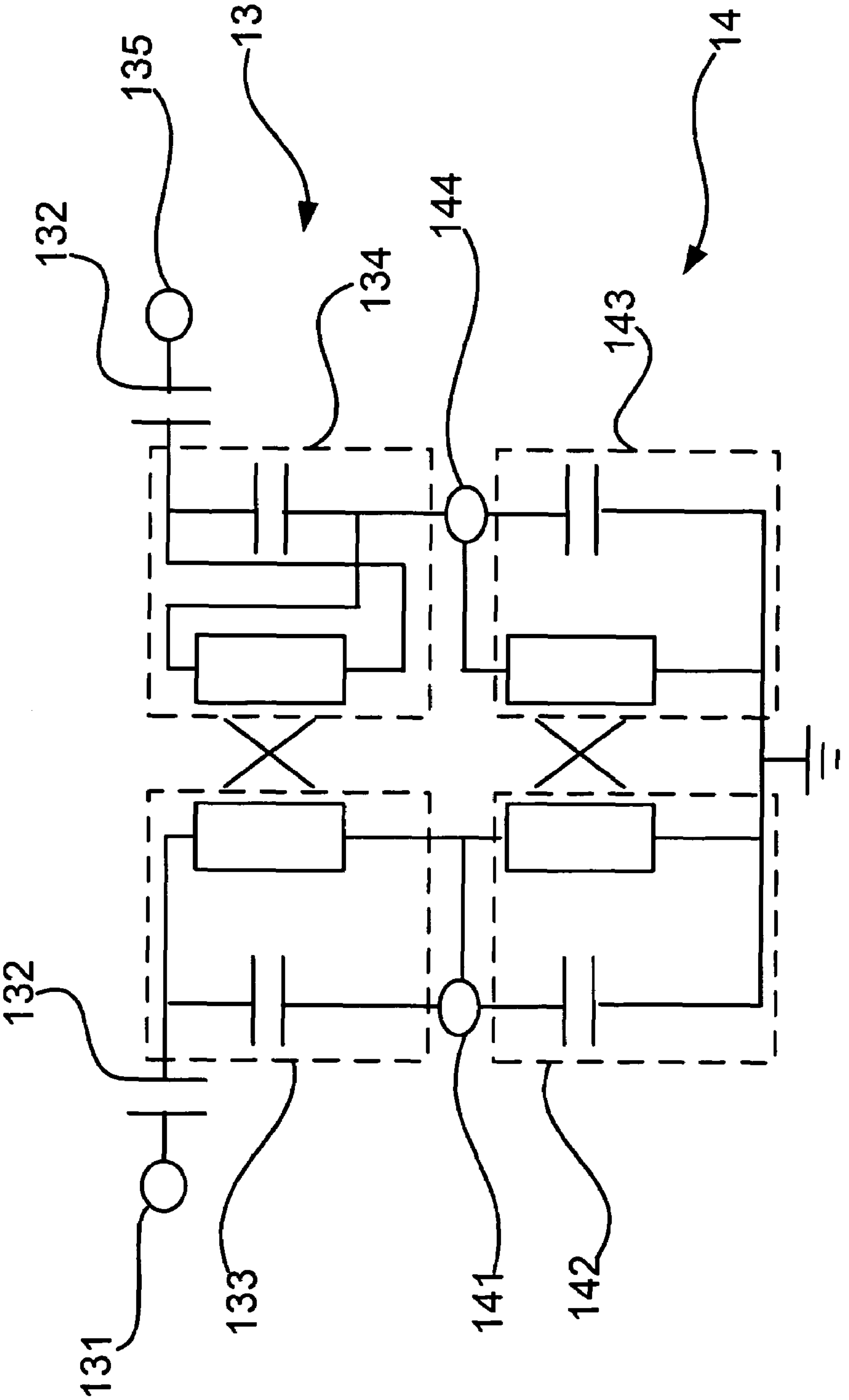
FIG. 3 is a structural view showing the circuit of the second preferred embodiment.

Please refer to FIG. 3, which is a structural view showing the circuit of a se con d preferred embodiment. As shown in the figure, the present invention is a dual bandpass filter having a serial configuration of coupled-line filters, comprising a second second-order capacitive bandpass filter 13 and a second second-order inductive bandpass filter 14.

The second second-order capacitive bandpass filter 13 has a third input 131 connected with a second DC capacitor 132 connecting to a fifth resonator 133; the fifth resonator 133 is coupled with a sixth resonator 134 in a way of a mutual capacitive coupling; and, the sixth resonator 134 is connected with a second DC capacitor 132 connecting to a third output 135. Therein, an end of the fifth resonator 133 and an end of the sixth resonator 134 are respectively connected with a fourth input 141 and a fourth output 144 of the second second-order inductive bandpass filter 14.

The second second-order inductive bandpass filter 14 connects to an end of the fifth resonator 133 with the fourth input 141; the fourth input 141 is connected with a seventh resonator 142; and, the seventh resonator 142 is coupled with an eighth resonator 143 in a way of a mutual inductive coupling to be connected with the fourth output 144 Therein, the seventh resonator 142 and the eighth resonator 143 of the second second-order inductive bandpass filter 14 are grounded; and, the fifth resonator 133 and the sixth resonator 134 are respectively connected with the seventh resonator 142 and the eighth resonator 143.

The second second-order capacitive bandpass filter 13 has inverted coupled-lines to obtain a mutual capacitive coupling with a phase having a 180 degrees of difference to a phase of the second second-order inductive bandpass filter 14. Thus, the second second-order capacitive bandpass filter 13 is serially connected with the second second-order inductive bandpass filter 14; and, by the impedance series of the second second-order capacitive bandpass filter 13 and the second second-order inductive bandpass filter 14, a finite transmission zero is obtained in a passband zone between the two bandpass filters. Therein, the second second-order capacitive bandpass filter 13 has a passband between 2 GHz and 3 GHz, having a bandwidth of 100 MHz; and, the second second-order inductive bandpass filter 14 has a passband between 5 GHz and 6 GHz, having a bandwidth of 1 GHz.

Figure 4:
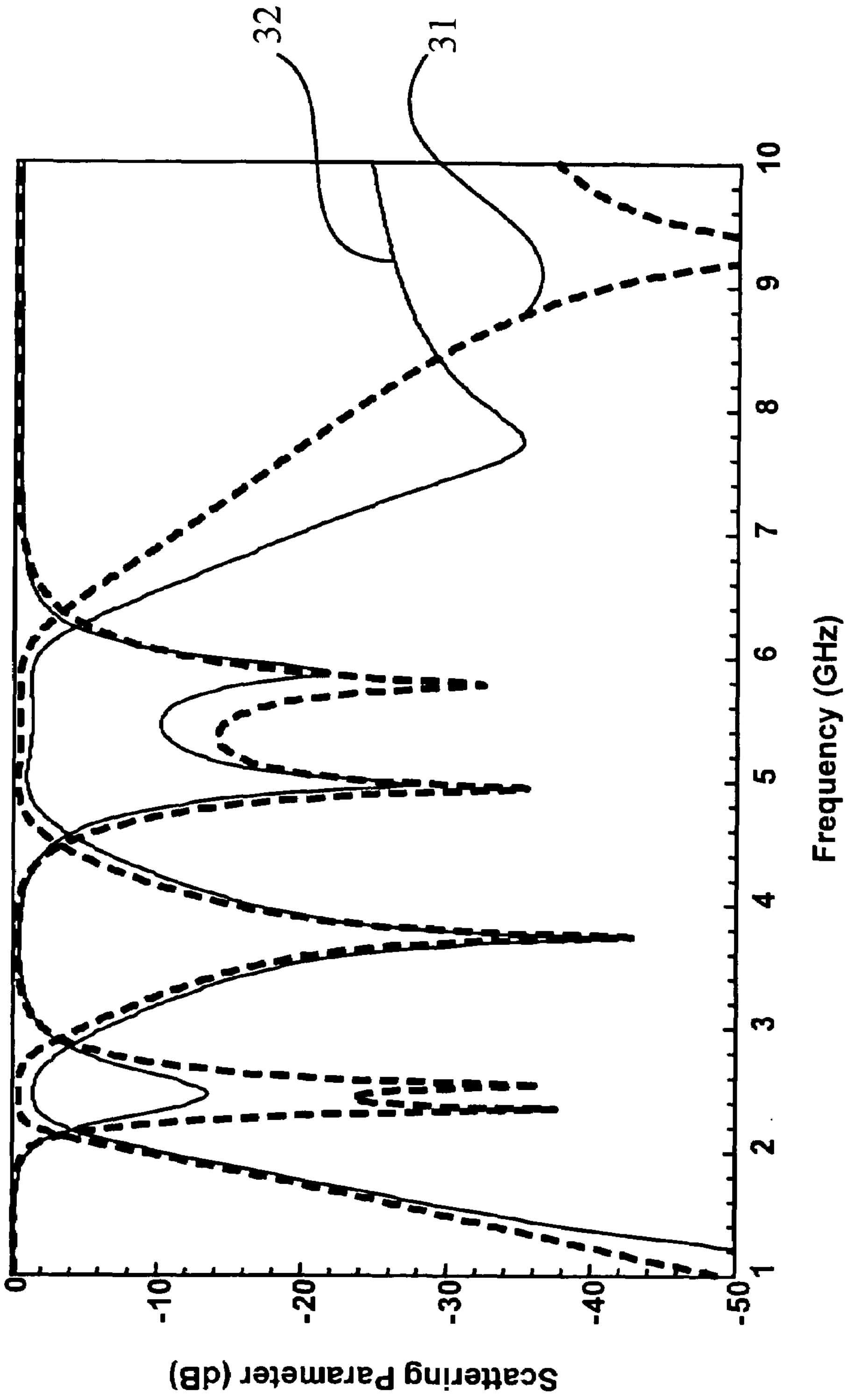
FIG. 4 is a view showing the spectrum of the second preferred embodiment.

Please refer to FIG. 4, which is a view showing the spectrum of the second preferred embodiment. As shown in the figure, a circuit simulation curve 31 and an EM simulation curve 32 of the second preferred embodiment are obtained, where, in a circuit structure of the second preferred embodiment, a finite transmission zero in a passband zone between a second-order inductive bandpass filter and a second-order capacitive bandpass filter is obtained to suppress noise to less than −40 dB.

To sum up, the present invention is a dual bandpass filter having a serial configuration of coupled-line filters, where a finite transmission zero is obtained through an impedance series to suppress noise and to obtain a wide bandwidth at a high passband and a low insertion loss at the passband; and, thus, a ratio of signal energy to noise energy is improved.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A dual bandpass filter having a serial configuration of coupled-line filters, comprising:

a second-order inductive bandpass filter, said second-order inductive bandpass filter connecting to a first resonator from a first input, said first resonator being coupled in series to a second resonator by way of a mutual inductive coupling, said second resonator connecting to a first output of the dual bandpass filter; and a second-order capacitive bandpass filter, said second-order capacitive bandpass filter connecting to a third resonator from a second input, said third resonator being coupled in series to a fourth resonator by way of a mutual capacitive coupling, said fourth resonator connecting to a second output of the dual bandpass filter.

2. The dual bandpass filter according to claim 1, wherein each of said first input and said first output is separately connected with a direct-current (DC) capacitor to obtain a series connection.

3. The dual bandpass filter according to claim 1, wherein said second input is connected with a DC capacitor to obtain a series connection.

4. The dual bandpass filter according to claim 1, wherein said second output is connected with a DC capacitor to obtain a series connection.

5. The dual bandpass filter according to claim 1, wherein said second-order inductive bandpass filter has a pass band.

6. The dual bandpass filter according to claim 1, wherein said second-order capacitive bandpass filter has a passband.

7. The dual bandpass filter according to claim 1, wherein said second-order inductive bandpass filter is connected with said second-order capacitive bandpass filter to obtain a series connection;

wherein an end of said first resonator and an end of said second resonator are respectively connected with said second input and said second output;

wherein said third resonator and said fourth resonator are grounded; and wherein a finite transmission zero is obtained in a passband zone between said second-order inductive bandpass filter and said second-order capacitive bandpass filter.

8. The dual bandpass filter according to claim 7, wherein said second-order inductive bandpass filter is connected with said second-order capacitive bandpass filter to obtain a series connection;

wherein an end of said first resonator and an end of said second resonator are respectively connected with said third resonator and said fourth resonator.

9. The dual bandpass filter according to claim 7, wherein said second-order inductive band pass filter has a passband between 2 gigahertz (GHz) and 3 GHz.

10. The dual bandpass filter according to claim 7, wherein said second-order capacitive bandpass filter has a passband between 5 GHz and 6 GHz.

11. The dual bandpass filter according to claim 1, wherein said second-order capacitive bandpass filter is connected with said second-order inductive bandpass filter to obtain a series connection;

wherein an end of said third resonator and an end of said fourth resonator are respectively connected with said first input and said first output;

wherein said first resonator and said second resonator are grounded; and wherein a finite transmission zero is obtained in a passband zone between said second-order capacitive bandpass filter and said second-order inductive bandpass filter.

12. The dual bandpass filter according to claim 11, wherein said second-order capacitive bandpass filter is connected with said second-order inductive bandpass filter to obtain a series connection;

wherein an end of said third resonator and an end of said fourth resonator are respectively connected with said first resonator and said second resonator.

13. The dual bandpass filter according to claim 11, wherein said second-order capacitive bandpass filter has a passband between 2 GHz and 3 GHz.

14. The dual bandpass filter according to claim 11, wherein said second-order inductive bandpass filter has a passband between 5 GHz and 6 GHz.

* * * * *